(12) United States Patent
Urai (10) Patent No.: US 7,978,475 B2
(45) Date of Patent: Jul. 12, 2011

(54) STRAIN REDUCTION FIXING STRUCTURE

(75) Inventor: Takashi Urai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/564,541

(22) Filed: Sep. 22, 2009

(65) Prior Publication Data

US 2010/0008048 A1    Jan. 14, 2010

Related U.S. Application Data

(63) Continuation of application No. PCT/JP2007/000338, filed on Mar. 29, 2007.

(51) Int. Cl.
*H05K 7/20* (2006.01)

(52) U.S. Cl. ........ 361/719; 361/704; 257/718; 257/719; 165/80.3

(58) Field of Classification Search .................. None
See application file for complete search history.

(56) References Cited

U.S. PATENT DOCUMENTS

| | | | | |
|---|---|---|---|---|
| 5,880,930 A * | 3/1999 | Wheaton | | 361/690 |
| 5,901,039 A * | 5/1999 | Dehaine et al. | | 361/704 |
| 5,963,428 A * | 10/1999 | Salmonson et al. | | 361/704 |
| 6,181,567 B1 * | 1/2001 | Roemer et al. | | 361/760 |
| 6,493,233 B1 * | 12/2002 | De Lorenzo et al. | | 361/752 |
| 6,697,263 B2 * | 2/2004 | Szu | | 361/816 |
| 7,019,979 B2 * | 3/2006 | Wang et al. | | 361/719 |
| 7,193,851 B2 * | 3/2007 | Yatskov | | 361/710 |
| 7,375,963 B2 * | 5/2008 | Eckberg et al. | | 361/704 |
| 7,708,579 B2 * | 5/2010 | Yeh | | 439/331 |
| 7,759,790 B2 * | 7/2010 | Ouyang | | 257/720 |
| 7,919,856 B2 | 4/2011 | Morita | | |
| 2006/0007659 A1 * | 1/2006 | Lee et al. | | 361/704 |
| 2006/0065421 A1 | 3/2006 | Arai et al. | | |
| 2006/0245165 A1 * | 11/2006 | Lin | | 361/704 |
| 2007/0217159 A1 * | 9/2007 | Long et al. | | 361/704 |
| 2008/0006924 A1 | 1/2008 | Morita | | |

FOREIGN PATENT DOCUMENTS

| | | |
|---|---|---|
| JP | 5-28077 | 4/1993 |
| JP | 9-153661 | 6/1997 |
| JP | 2000-277976 | 10/2000 |
| JP | 2000-299577 | 10/2000 |
| WO | 2006/082633 | 8/2006 |
| WO | WO-2006/087769 | 8/2006 |

OTHER PUBLICATIONS

"Extended European Search Report", mailed by EPO and corresponding to European patent application No. 07 736 995.7 on May 6, 2011.

* cited by examiner

*Primary Examiner* — Boris L Chervinsky
(74) *Attorney, Agent, or Firm* — Fujitsu Patent Center (57) ABSTRACT

A strain reduction fixing structure includes a counterbore formed around a through-hole on a printed circuit board through which a fixing shaft for fixing the printed circuit board to a protection plate member penetrates.

7 Claims, 15 Drawing Sheets

PRIOR ART

FIG. 1

PRIOR ART

FIG. 2

PRIOR ART

F I G. 3

PRIOR ART

| GAUGE POSITION | A | B | C | D |
|---|---|---|---|---|
| CONVENTIONAL Max STRAIN | 434.3 | 423.6 | 389.5 | 114.3 |
| INVENTION Max STRAIN | 193.5 | 215.7 | 180.3 | 148.0 |

F I G. 1 3

|  | PRINTED BOARD THICKNESS : b | COUNTERBORE | THICKNESS OF COUNTERBORE PART : a | GAUGE POSITION : STRAIN VALUE | | | | | REDUCTION EFFECT |
|---|---|---|---|---|---|---|---|---|---|
|  |  |  |  | A | B | C | D | Max |  |
| SAMPLE 1 | 4.00 | 0.00 | 4.00 | 434.3 | 423.6 | 389.5 | 114.3 | 434.3 | ---- |
| SAMPLE 2 | 4.00 | 2.00 | 2.00 | 193.5 | 215.7 | 180.3 | 148.0 | 215.7 | 50.3% |
| SAMPLE 3 | 4.00 | 3.00 | 1.00 | 115.2 | 134.8 | 84.8 | 25.3 | 134.8 | 69.0% |

F I G. 1 4

F I G. 1 5

STRAIN REDUCTION FIXING STRUCTURE

CROSS-REFERENCE TO RELATED APPLICATION

This application is a continuation application of International PCT Application No. PCT/JP2007/000338 which was filed on Mar. 29, 2007.

FIELD

The present invention relates to a strain reduction fixing structure, and more particularly, to a strain reduction fixing structure in a fixing structure between a protection plate member for protecting a BGA junction part of a printed circuit board from external force and the printed circuit board.

BACKGROUND

Conventionally, in order to protect a BGA (Ball Grid Array) junction part of a printed circuit board from an impact due to external force, a protection plate member called a bolster plate or stiffener is disposed on the back side of the surface of the printed circuit board on which the BGA package for semiconductor device is provided, and the protection plate member and the printed circuit board are fixed by fastening them firmly by a bolt and the like.

Figure 1:
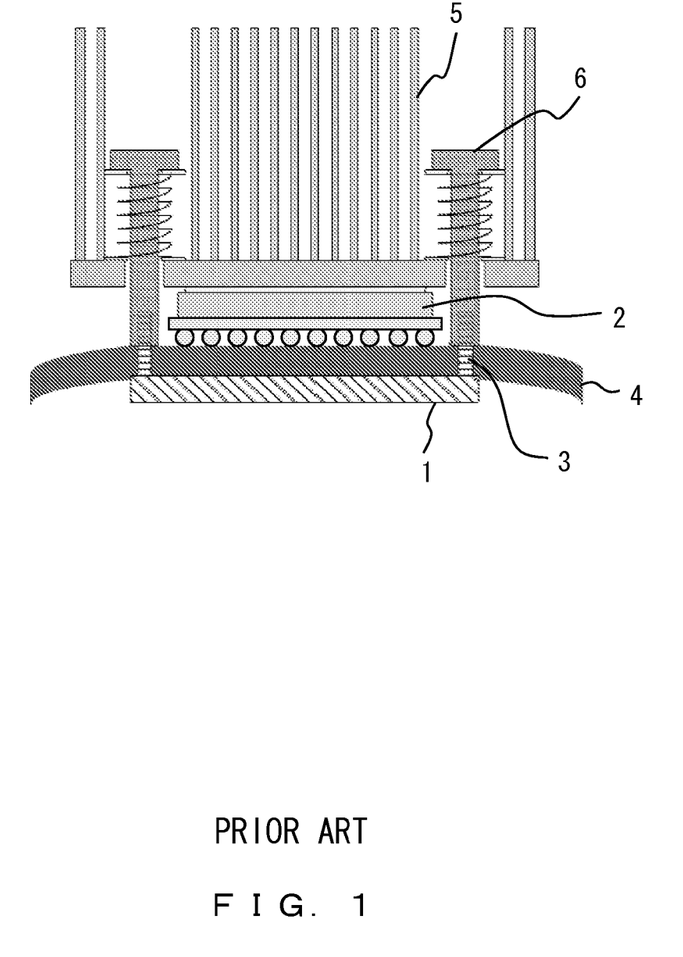
FIG. 1 is a diagram illustrating a state in which a bolster plate is fixed to the back side of the surface of a conventional printed circuit board on which the BGA package is provided.

FIG. 1 is a diagram illustrating a state in which a bolster plate is fixed on the back surface of the surface of a printed circuit board on which a BGA package for semiconductor device is provided.

As illustrated in FIG. 1, a bolster plate 1 is formed to be larger than a BGA package 2 by the size of the fastening positions provided on the four corners. An embedded bolt 3 is set upright on the fastening position on the four corners, and a bolt through-hole is made in advance at the position corresponding to the embedded bolt 3.

FIG. 1 illustrates a state in which the embedded bolt 3 of the bolster plate 1 is put through a bolt through-hole on a printed circuit board 4, and the printed circuit board 4 and the bolter plate 1 is fixed by threadably mounting the lower-end part of a spring pressing stick-like nut 6 held by a heat sink on the head part of the embedded bolt 3 and fastening the spring pressing stick-like nut 6.

Figure 2:
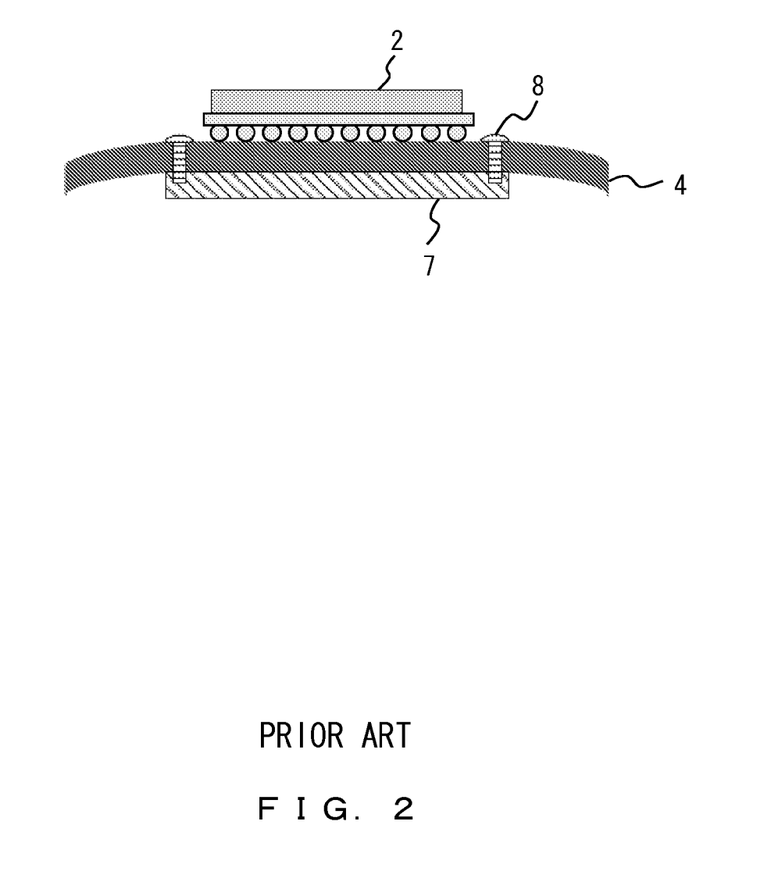
FIG. 2 is a diagram illustrating a state in which a stiffener is fixed to the back side of the surface of a conventional printed circuit board on which the BGA package is provided.

FIG. 2 is a diagram illustrating a state in which a stiffener is fixed on the back side of the surface of a printed circuit board on which a BGA package is provided. A stiffener 7 illustrated in FIG. 2 is also formed to be larger than the BGA package 2 by the size of the fastening positions provided on the four corners. A female screw is provided on the fastening position on the four corners.

In addition, a bolt through-hole is made in advance at the position corresponding to the female screw on the printed circuit board 4.

FIG. 2 illustrates a state in which a male screw 8 is put through a bolt through-hole on the printed circuit board 4, and the printed circuit board 4 and the stiffener 7 are fixed by turning a straight slot or a cross slot formed on the head part of the male screw 8 using a straight slot screw driver or a cross slot screw driver to fasten the male screw 8.

Meanwhile, on the printed circuit board 4, a deflection or warpage of the circuit board easily occurs due to the mounting of the BGA package 2.

Figure 3:
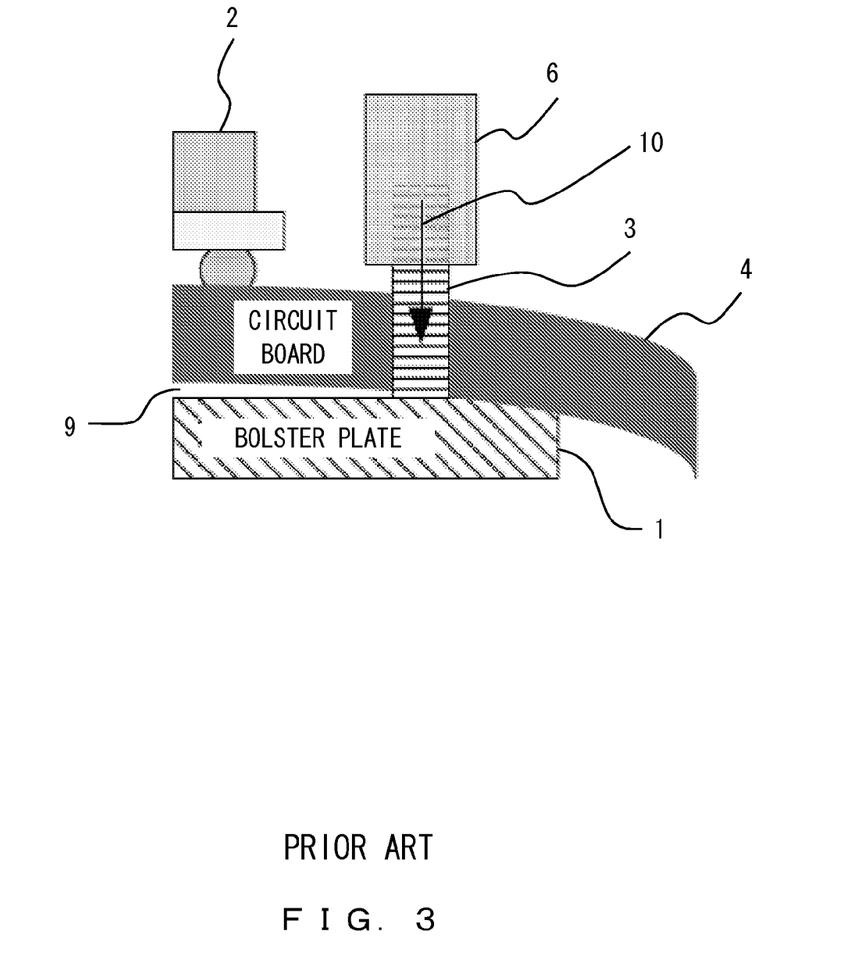
FIG. 3 is a diagram illustrating a state immediately before fixing a bolster plate to the back side of the surface of a conventional printed circuit board on which the BGA package is provided.

FIG. 3 is a diagram illustrating a state immediately before fixing a bolster plate on the back side of the surface of a conventional printed circuit board on which a BGA package is provided. As illustrated in FIG. 3, a deflection (or warpage) is generated on the printed circuit board 4 on which the BGA package 2 is mounted.

Therefore, at the stage where the embedded bolt 3 of the bolster plate 1 is put through the bolt through-hole on the printed circuit board 4 and the lower-end part of the spring pressing stick-like nut 6 held by the heat sink 5 is merely mounted on the head part of the embedded bolt 3 threadably, a gap 9 is formed between the upper surface of the bolster plate 1 and the lower surface of the printed circuit board 4.

As the spring pressing stick-like nut 6 is fastened in this state as illustrated with an arrow 10 in FIG. 3, the deflection or warpage generated on the printed circuit board 4 is corrected by the bolster plate 1, and the printed circuit board 4 closely contacts the bolster plate 1 with no gap.

Figure 4:
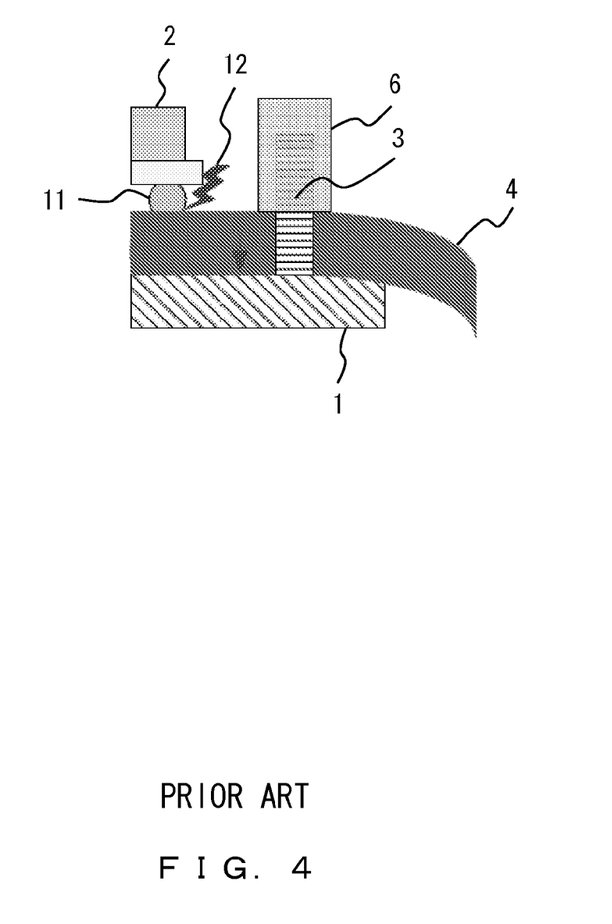
FIG. 4 is a diagram illustrating a strain generated when a bolster plate is fixed to the back side of the surface of a conventional printed circuit board on which the BGA package is provided.

FIG. 4 is a diagram illustrating a state in which the deflection or warpage generated on the printed circuit board 4 as illustrated in FIG. 3 is corrected by fixing a bolster plate on the back side of the surface of the conventional printed circuit board 4 on which the BGA package is provided.

However, the correction generates an internal stress on the printed circuit board 4, and a large strain occurs on the junction part the BGA package 2 to a bump 11, especially on the bump junction part on the outer circumference of the BGA package 2.

FIG. 4 schematically illustrates a strain 12 generated on the junction part of the bump 11. When the large strain 12 is generated on the bump junction part like this, it contributes to the acceleration of fatigue breakdown of the junction part, decreasing the reliability of the junction part and causing a problem that the reliability of the whole device decreases due to the malfunction of an operational circuit device such as a CPU (central processing unit) contained in the BGA package 2.

In addition, the problem occurs in the same way when the stiffener 7 is fixed on the printed circuit board 4 as illustrated in FIG. 2.

Patent document 1: No prior-art document that is comparable to the present invention has been found.

SUMMARY

In view of the above conventional situation, the present invention aims at providing a strain reduction fixing structure that reduces strain as much as possible in a fixing structure between a protection plate member and a printed circuit board.

A strain reduction fixing structure of the present invention is configured to form a counterbore around a through-hole on a printed circuit board through which a fixing shaft for fixing the printed circuit board to a protection plate member penetrates.

The strain fixing structure is configured so that $b/2 \geq a$ when a remaining board thickness of the formed counterbore part is assumed as a and a thickness of the printed circuit board is assumed as b.

In addition, the configuration is made so that the protection plate member is a bolster plate or a stiffener, and the fixing shaft is an embedded bolt set upright on a bolster plate or a male screw mounted threadably on a female screw of a stiffener.

DESCRIPTION OF EMBODIMENT

Embodiment 1

Figure 5:
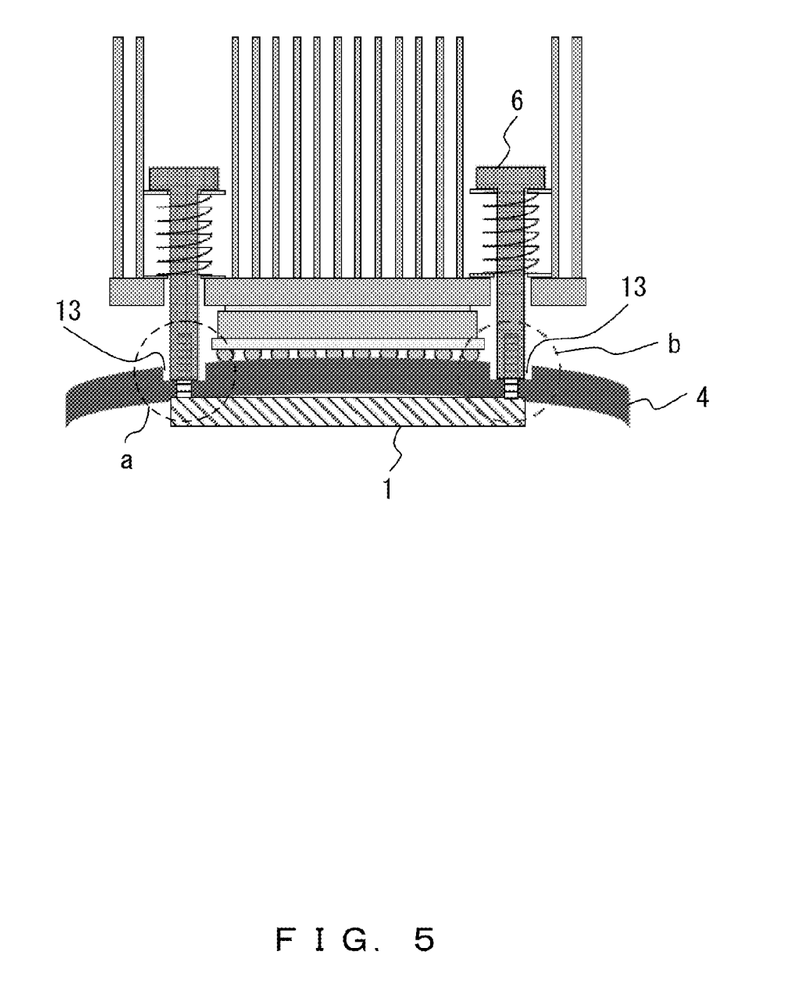
FIG. 5 a diagram illustrating a state in embodiment 1 in which a counterbore is additionally formed around a fixing shaft through-hole on a printed circuit board fixed on a bolster plate, and the printed circuit board is fastened by a spring pressing stick-like nut.

FIG. 5 is a diagram illustrating a state in embodiment 1 in which a counterbore 13 is additionally formed around a fixing shaft through-hole on a printed circuit board 4 fixed on a bolster plate 1, and the printed circuit board is fastened by a spring pressing stick-like nut 6.

Figure 6:
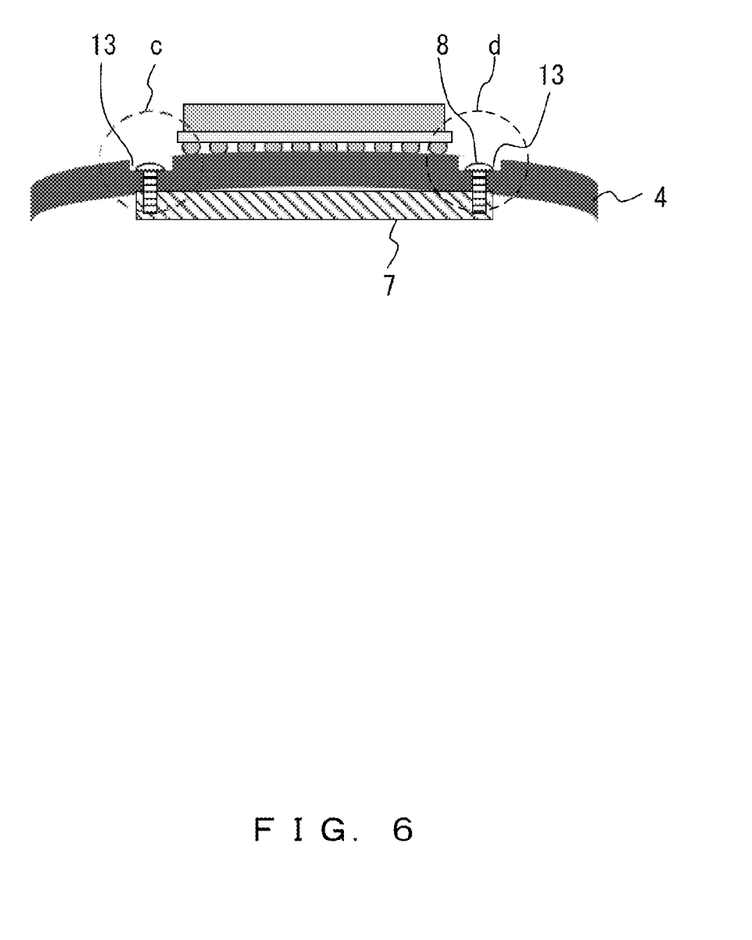
FIG. 6 is a diagram illustrating a state in embodiment 1 in which a counterbore is additionally formed around a fixing shaft through-hole on a printed circuit board fixed on a stiffener, and the printed circuit board is fastened by a male screw.

FIG. 6 is a diagram illustrating a state also in embodiment 1 in which a counterbore 13 is additionally formed around a fixing shaft through-hole on a printed circuit board fixed on a stiffener 7, and the printed circuit board is fastened by a male screw 8.

In FIG. 5 and FIG. 6, the counterbore 13 is formed around all fixing shaft through-holes enclosed with broken-line circles a, b, c, d on the printed circuit board 4.

Figure 7:
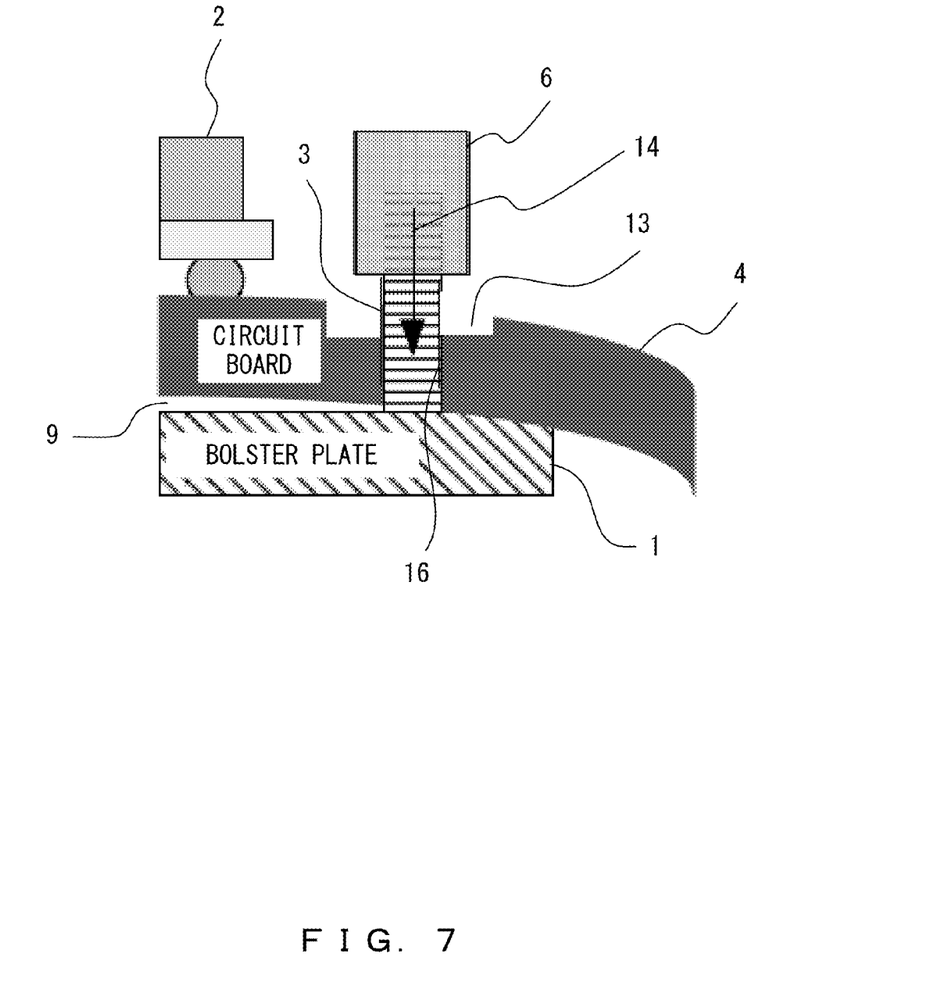
FIG. 7 is a diagram illustrating a state in embodiment 1 immediately before fixing a bolster plate to the back side of the surface of a printed circuit board on which a BGA package is provided.

FIG. 7 is a diagram illustrating a state in embodiment 1 immediately before fixing a bolster plate 1 to the back side of the surface of a conventional printed circuit board 4 on which the BGA package 2 is provided.

As illustrated in FIG. 7, a deflection (or warpage) is generated on the printed circuit board 4 on which a BGA package 2 is mounted.

As illustrated in FIG. 7, at the stage where the lower-end part of the spring pressing stick-like nut 6 at the heat sink 5 side is merely mounted on the head part of the embedded bolt 3 threadably and fastening has not been performed yet, a gap 9 due to the deflection of the printed circuit board 4 is formed between the upper surface of the bolster plate 1 and the lower surface of the printed circuit board 4.

As the spring pressing stick-like nut 6 is fastened in this state as illustrated with an arrow 14 in FIG. 7, the strain due to the correction of deflection or warpage generated on the printed circuit board 4 by the bolster plate 1 is dispersed as a strain 12a that concentrates around the edge of the bottom surface of the counterbore part, and a strain b generated on the junction part of the bump 11.

Figure 8:
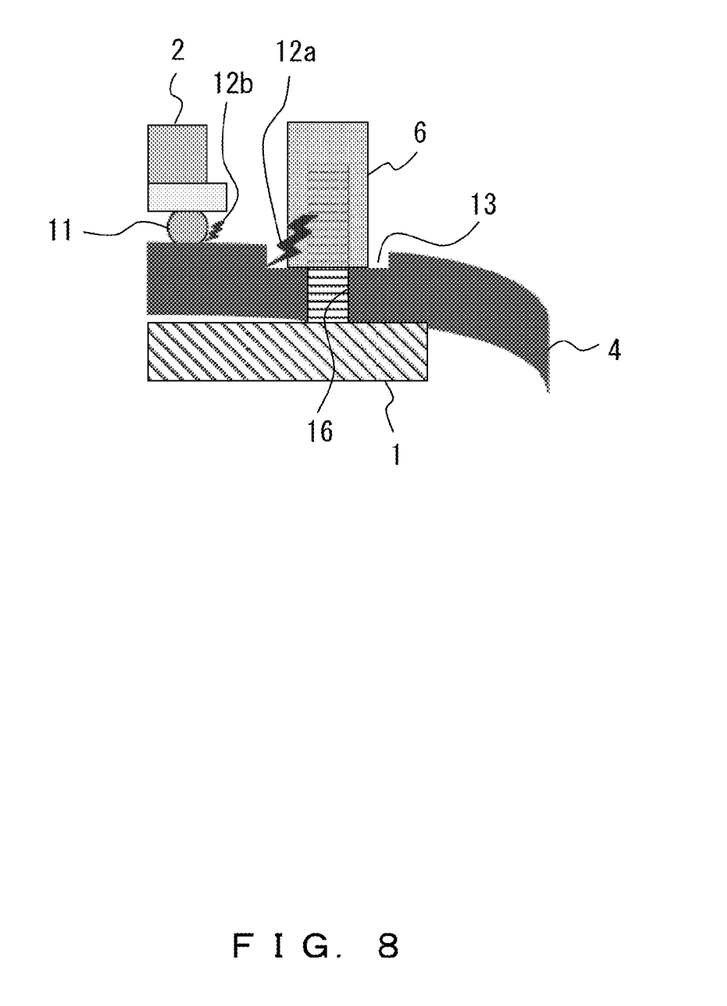
FIG. 8 is a diagram schematically illustrating a state in which, when a printed circuit board is fixed to a bolster plate, the strain is dispersed to around the edge of the bottom surface of the counterbore part, and to the junction part of a bump.

FIG. 8 is a diagram schematically illustrating a state in which, when the printed circuit board 4 is fixed to the bolster plate 1, the strain is dispersed as a strain 12a that concentrates around the edge of the bottom surface of the counterbore part, and a strain b generated on the junction part of the bump 11.

As illustrated in FIG. 8, the large strain 12a is absorbed around the edge of the bottom surface of the counterbore part, and only the small strain 12b is applied to the bump junction part, making it possible to reduce the strain given to the junction part of the bump 11.

The principle for the reduction of the strain can be regarded as the following two points. Firstly, it seems to be because, since "circuit-board bending strength of the BGA package 2">"bending strength of the circuit-board fixing part on which the counterbore is formed", a large part of the correction force (strain) generated on the fixing part seems to be absorbed in the fixing part of which bending strength is weak.

Secondly, it seems to be because, the distance from the bump 11 in the peripheral part of the BGA package 2 to the fixing part is increased by the depth of the counterbore, and the strain transmitted from the fixing part to the bump 11 is reduced by the amount of the increase in the distance.

Meanwhile, the completely same effect is obtained with a case in which the printed circuit board is fixed on the stiffener 7, but only the bolster plate 1 is explained below for making the explanation simple.

Here, the effect that, as described above, by forming a counterbore around the fixing shaft through-hole on the printed circuit board 4, even when the printed circuit board 4 is firmly fixed using the bolster plate 1 and the spring pressing stick-like nut 6, the strain concentrates on the edge part of the bottom surface of the counterbore part of which bending strength is weak, reducing the correction of the deflection or warpage in the junction part of the bump 11 and suppressing the strain to be small, is verified below.

First, as devices used for the measurement of strain, a data analyzer EDX-1500A and a strain gauge KFG-1-120-D17-16M2L2S produced by Kyowa Electronic Instruments Co., Ltd. are prepared.

Next, the strain gauge is installed in the vicinity (four positions) of a BGA package of a conventional printed circuit on which no counterbore is formed around a fixing shaft through-hole.

Figure 9:
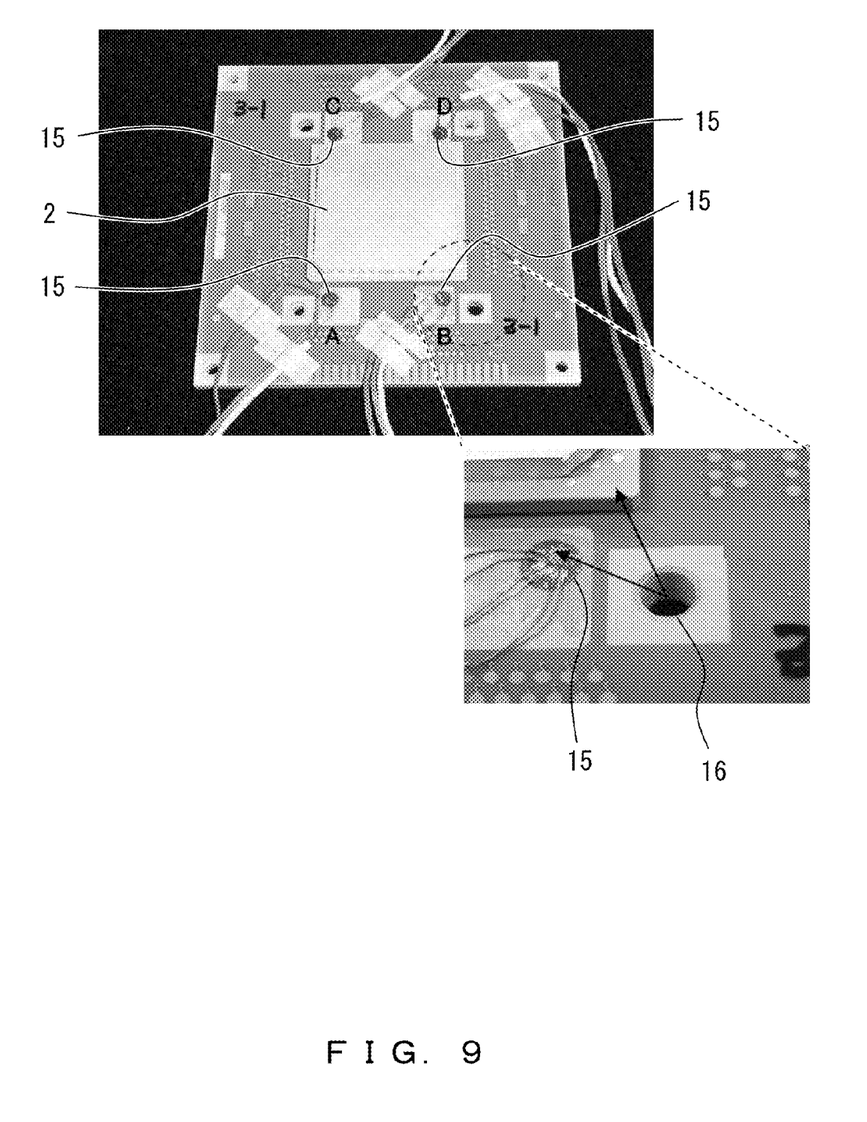
FIG. 9 is a diagram illustrating the installment state of a strain gauge to a printed circuit board on which no counterbore is formed.

FIG. 9 is a diagram illustrating the installment state of the strain gauge to the printed circuit board 4 on which no counterbore is formed. For the installment of the strain gauge, a strain gauge 15 and six cables in total (two white, two blue, two red) are installed on predetermined positions on the printed circuit board 4 by an instant adhesive.

The four positions in the vicinity of the BGA package 2 on which the strain gauge is installed are, as illustrated in FIG. 9, the positions as close as possible to the BGA package 2 on the circumstance drawn with the distance from a fixing shaft through-hole 16 of the printed circuit board 4 to the closest bump (bumps at the four corners of the BGA package 2) as the radius.

The symbols for the installment positions are, position A for the lower left corner in FIG. 9, B for the lower right corner, C for the upper left corner, and D for the upper right corner.

The distance from the fixing shaft through-hole 16 to the installment positions A, B, C or D of the strain gauge 15 and the distance from the fixing shaft through-hope 16 to the bumps at the four corners that are subject to the largest strain on the BGA package 2 are configured as the same, so the value of the strain measured at the installment positions of the strain gauge 15 can be regarded as approximately same as the strain generated in the bump junction part on the four corners.

After the installment of the strain gauge 15 illustrated in FIG. 9, the six cables (total 24 cables for the four strain gauges) extending from the strain gauge 15 is connected to the data analyzer not illustrated in the drawing.

Figure 10:
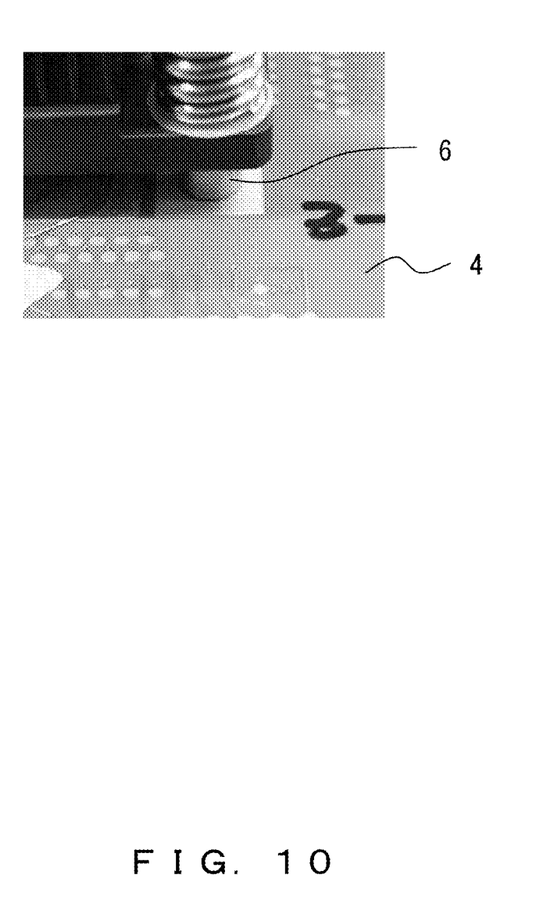
FIG. 10 is a diagram illustrating a state in which the printed circuit board is fastened by the spring pressing stick-like nut of the bolster plate 1 in the state in FIG. 9.

FIG. 10 is a diagram illustrating a state in which the printed circuit board 4 is fastened by the spring pressing stick-like nut 6 of the bolster plate 1, in a state in which the strain gauge 15 illustrated in FIG. 9 is installed and each cable is connected to the data analyzer not illustrated in the drawing.

Figure 11:
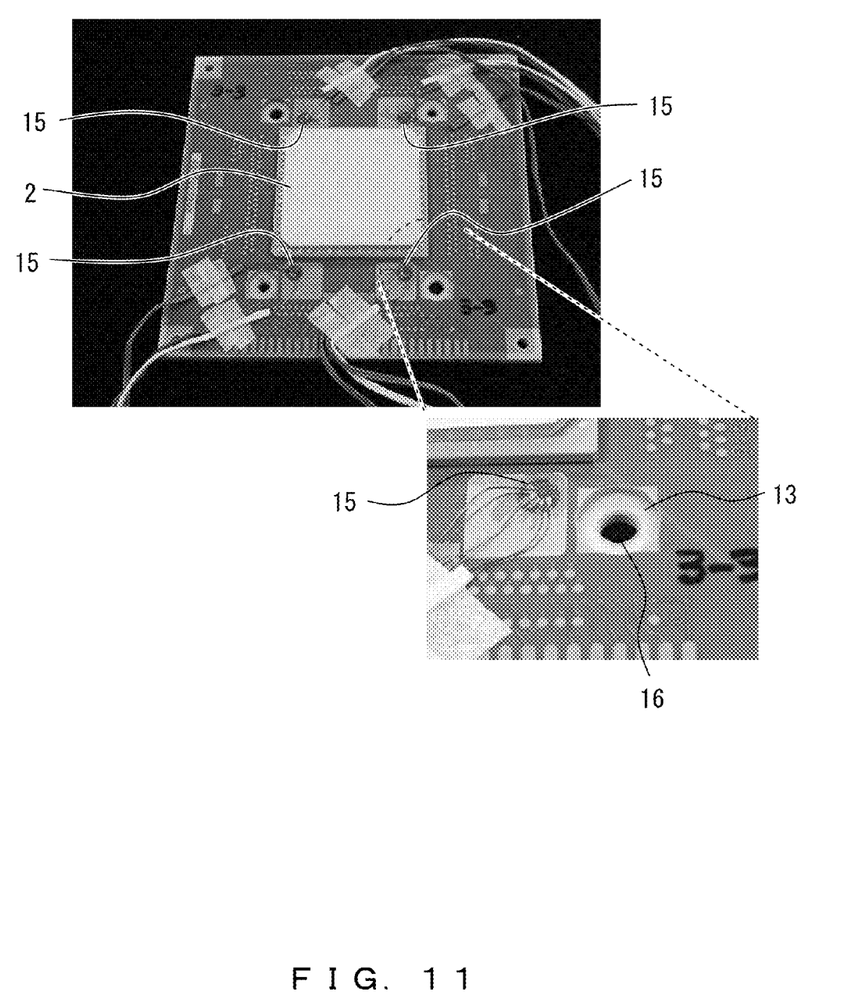
FIG. 11 is a diagram illustrating the installment state of a strain gauge to a printed circuit board on which a counterbore is formed around a fixing shaft through-hole.

FIG. 11 is a diagram illustrating the installment state of the strain gauge 15 to the printed circuit board 4 on which a counterbore 13 is formed around a fixing shaft through-hole 16. The installment position and the installment state of the strain gauge 15 are completely the same as the case in FIG. 9.

Figure 12:
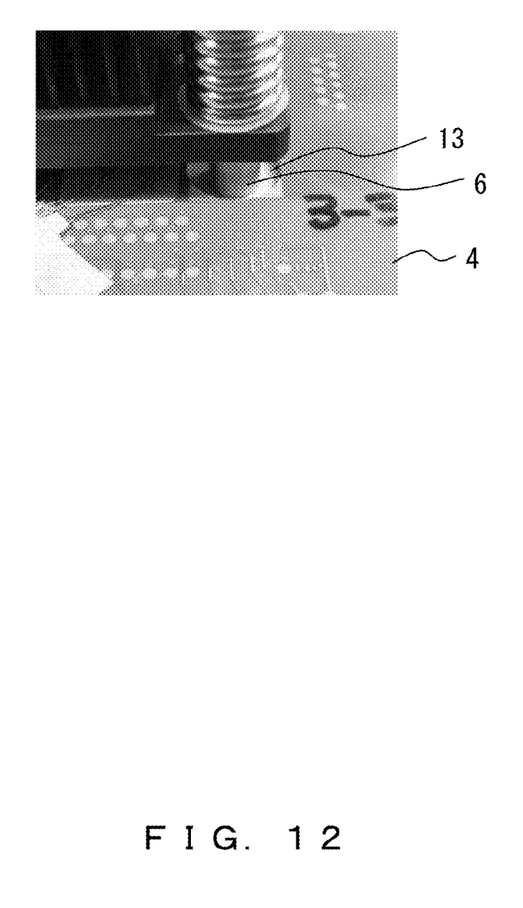
FIG. 12 is a diagram illustrating a state in which the printed circuit board is fastened by the spring pressing stick-like nut of the bolster plate, in the installment state of the strain gauge illustrated in FIG. 11.

FIG. 12 is a diagram illustrating a state in which the printed circuit board 4 is fastened by the spring pressing stick-like nut 6 of the bolster plate 1, in the installment state of the strain gauge 15 illustrated in FIG. 11.

In both FIG. 10 and FIG. 12, the spring pressing stick-like nut 6 was fastened for the position A, position D, position B, and position C in this order. In addition, all fastening was performed at a torque of 5.0 Kgf·cm.

Then, at that time, the result of the measurement by the strain gauge 15 of a generated strain value (με) was recorded by the data analyzer and compared.

The sample specification for evaluation was "TEG circuit board: □110 mm×t4 mm", "PKG: □47.5 mm ceramic package", "BGA: Sn—Ag—Cu (number: 2116 units)".

Figure 13:
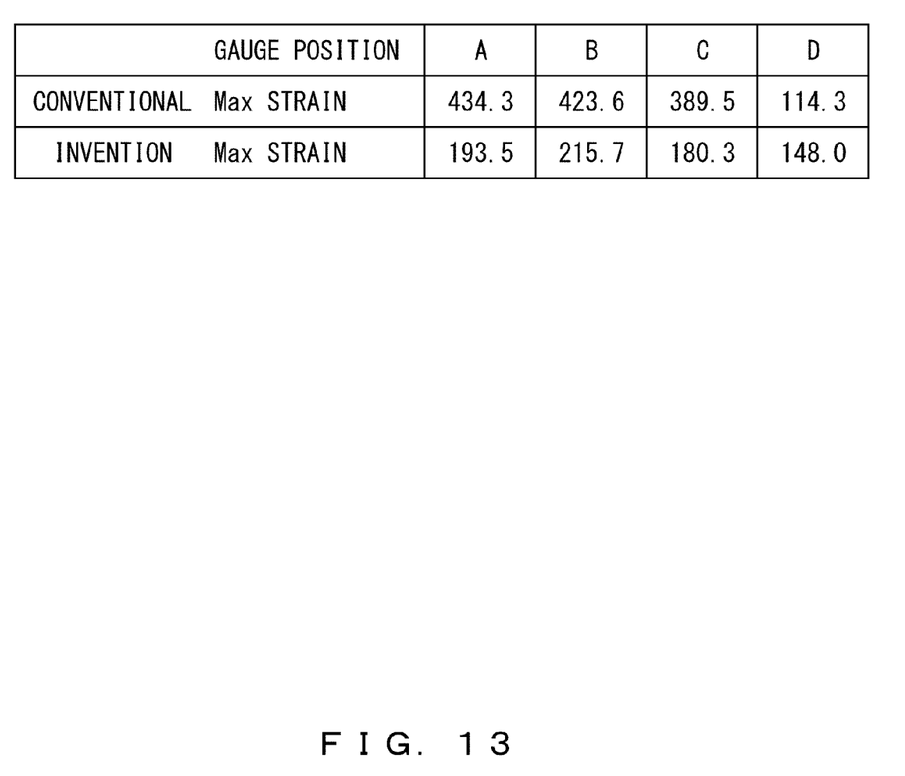
FIG. 13 is a list of the maximum strain at each positions of A, B, C and D in a printed circuit board on which no counterbore is formed (conventional) and a printed circuit board according to the embodiment on which a counterbore is formed (invention).

FIG. 13 is a list of the maximum strain at each positions of A, B, C and D in the printed circuit board on which no counterbore is formed (conventional) and the printed circuit board according to the embodiment on which the counterbore 13 is formed (invention).

The maximum strain at the four positions of A, B, C and D was, 434.3με that was measured at the position A for the conventional example, and 215.7με that was measured at the position B for the example of the invention. In other words, it becomes clear that, with the circuit-board configuration in which a counterbore is formed, the maximum strain generated in the junction part of a bump can be equal to or less than ½ of that in the case of a circuit-board configuration with no counterbore.

At the measurement position D, the evaluation was inverse for the conventional example and the example of the invention, seemingly due to the warpage of the printed circuit board 4, the variation in the flatness of the bump 11, and so on.

Here, in order to study the relation between the depth of the counterbore and the strain reduction effect, a similar measurement of strain as described above is performed while further adding a sample.

Figure 14:
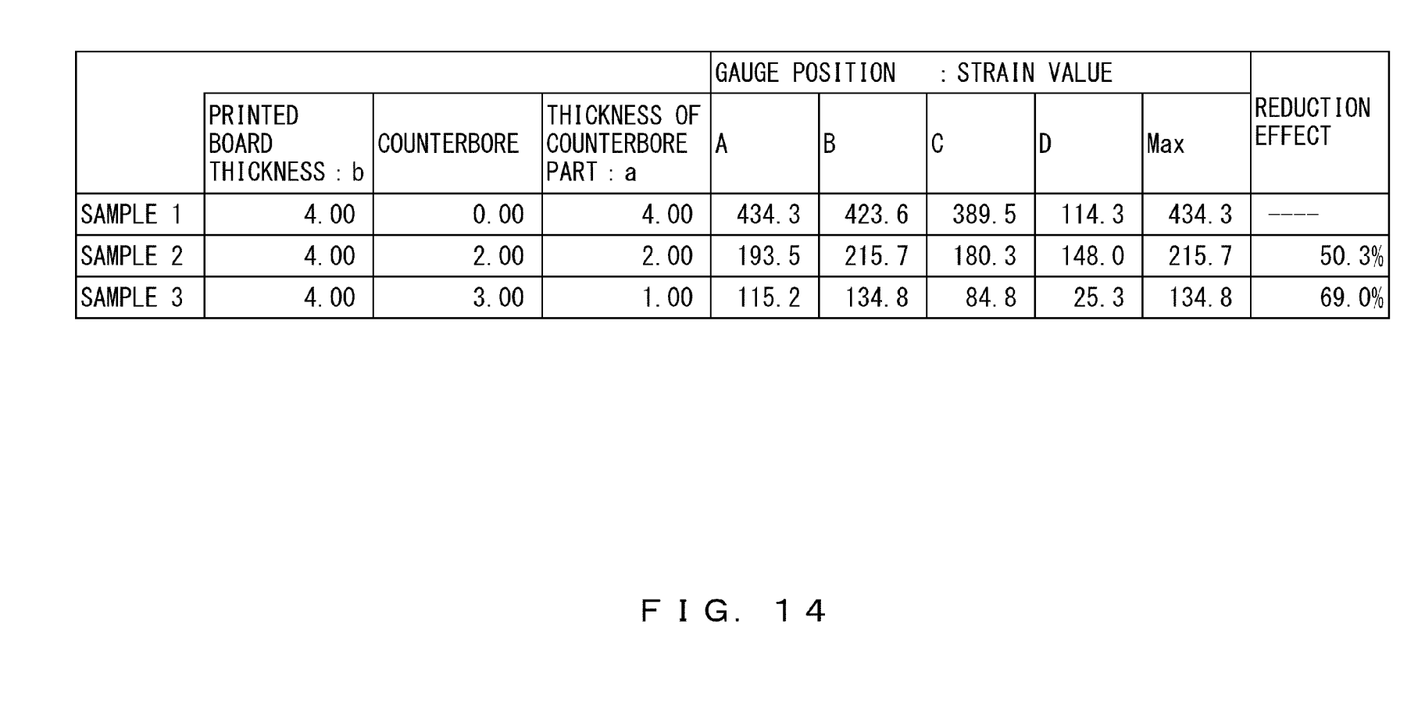
FIG. 14 is a table of the evaluation of the reduction rate of the maximum strain of three kinds of samples with respect to the relation between the printed board thickness and the board thickness of the counterbore part.

FIG. 14 is a table of the evaluation of the strain of three kinds of samples where the remaining board thickness of the counterbore part (hereinafter, simply referred to as the board thickness of the counterbore part) that is inversely proportional to the depth of the counterbore is assumed as a, and the thickness of the printed circuit board 4 before the counterbore is formed (hereinafter, simply referred to as the printed board thickness) as b, instead of the depth of the counterbore.

The table in FIG. 14 lists samples 1, 2 and 3 as the three kinds of samples on the extreme left, followed by the printed board thickness b, counterbore (depth of counterbore), thickness of counterbore part (remaining board thickness) a, strain value for each of the gauge positions A, B, C, D, maximum (Max) value of the strain values, and strain reduction effect (%), to the right. The unit is mm for sizes, and με for strain.

Meanwhile, the Max value of the strain of the sample 1 is adopted as the reference value of the strain reduction effect. Here, the samples 1 and 2 are the conventional example and the example of the invention illustrated in FIG. 13. In FIG. 14, the sample 3 is added further.

As illustrated in FIG. 14, it is assumed as the printed board thickness b of the sample 1=4.00 (mm), counterbore (depth of counterbore)=0.00 (mm), thickness of counterbore part (remaining board thickness) a=4.00 (mm). In other words, no counterbore is formed. Then, the Max value of the strain is, as also illustrated in FIG. 13, 434.3(με).

Meanwhile, it is assumed ad the printed board thickness b of the sample 2=4.00 (mm), counterbore (depth of counterbore)=2.00 (mm), thickness of counterbore part (remaining board thickness) a=2.00 (mm). In other words, the thickness of the counterbore part (remaining board thickness) is ½ of the printed board thickness b. Then, the Max value of the strain is, as also illustrated in FIG. 13, 215.7(με). This is 50.3%, assuming the Max value 434.3(με) of the sample 1 as 100(%).

Meanwhile, it is assumed as the printed board thickness b of the sample 3=4.00 (mm), counterbore (depth of counterbore)=3.00 (mm), thickness of counterbore part (remaining board thickness) a=1.00 (mm). In other words, the thickness of the counterbore part (remaining board thickness) is ¼ of the printed board thickness b. Then, the Max value of the strain is 134.8(με). This is 69.0%, assuming the Max value 434.3(με) of the sample 1 as 100(%).

Figure 15:
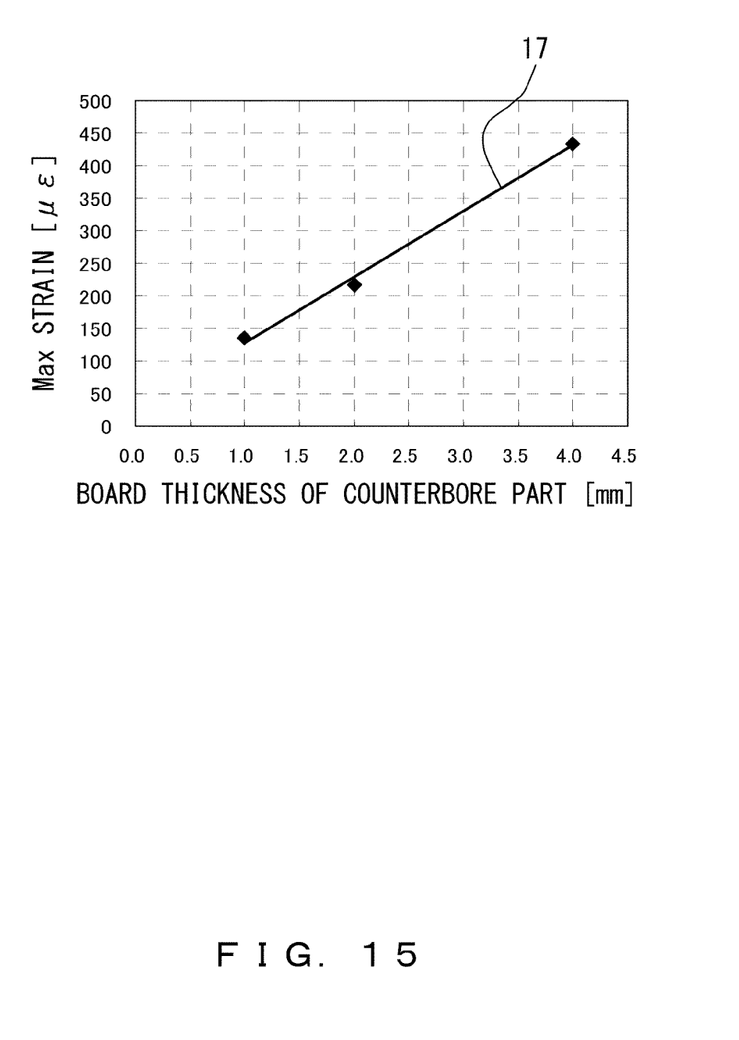
FIG. 15 is a characteristics diagram illustrating the relation between the board thickness of the counterbore part and the Max strain obtained from the data of the evaluation table in FIG. 14.

FIG. 15 is a characteristics diagram illustrating the relation between the board thickness of the counterbore part and the Max strain obtained from the data of the evaluation table described above. In the figure, the horizontal axis represents the board thickness (mm) of the counterbore part from 0 to 4.5, and the vertical axis represents the Max strain (με) from 0 to 500.

The characteristics diagram illustrated here is obtained by plotting the Max values 434.3, 215.7, 134.8 corresponding to the board thickness of the counterbore part a=4.0, 2.0, 1.0 of the samples 1, 2, 3 in FIG. 14, respectively, with a square black mark from right to left, and obtaining their approximate curve by, for example, the least-square method.

An approximate curve 17 in the figure is a straight line sloping down to the left, and considering the evaluation table in FIG. 14 and the characteristics diagram in FIG. 15 together, it becomes clear that, when the thickness of the counterbore part is assumed as a and the thickness of the printed circuit board is assumed as b, forming a counterbore so that $b/2 \geqq a$, the strain reduction effect with which the strain decreases gradually from around 50% can be obtained.

In addition, the approximate curve 17 in FIG. 15 indicates that, as long as a sufficient fixing strength can be obtained between the printed circuit board and the bolster plate or the stiffener, the deeper the thickness of the counterbore (the thinner the thickness of the counterbore part), the more effect can be obtained.

What is claimed is:

1. A strain reduction fixing structure comprising:
 a counterbore formed around a through-hole on a printed circuit board through which a fixing shaft for fixing the printed circuit board to a protection plate member penetrates.

2. The strain reduction fixing structure according to claim 1, wherein when a remaining board thickness of the formed counterbore part is assumed as a and a thickness of the printed circuit board is assumed as b, $b/2 \geqq a$.

3. The strain reduction fixing structure according claim 1, wherein the protection plate member is a bolster plate or a stiffener.

4. The strain reduction fixing structure according to claim 1, wherein the fixing shaft is an embedded bolt set upright on a bolster plate or a male screw mounted threadably on a female screw of a stiffener.

5. A semiconductor package structure comprising:
 a semiconductor device;
 a heat-radiating plate having a first plurality of through-holes for putting fasteners through and radiating heat from the semiconductor device;
 a printed board on which the semiconductor device is mounted and having a second plurality of through-holes for putting the fasteners through and a counterbore formed around each of the through-holes;
 a protection plate member being disposed on a back side of a surface of the printed board on which the semiconductor device is mounted and protecting a junction part between the semiconductor device and the printed board; and
 the fasteners each of which penetrates through one of the first through-holes and one of the second through-holes successively and fixing the heat-radiating plate, the printed board and the protection plate member.

6. The semiconductor package structure according to claim 5, wherein each of the fasteners further comprises a spring held by an end of the fastener and the heat-radiating plate.

7. A semiconductor package structure comprising:
 a semiconductor device;
 a printed board on which the semiconductor device is mounted and having a through-hole for putting fastening means through and a counterbore formed around the through-hole;
 a protection plate member being disposed on a back side of a surface of the printed board on which the semiconductor device is mounted and protecting a junction part between the semiconductor device and the printed board; and
 the fastening means penetrating through the through-hole successively and fixing the printed board and the protection plate member.

\* \* \* \* \*